(12) United States Patent
Connor et al.

(10) Patent No.: US 9,977,075 B1
(45) Date of Patent: May 22, 2018

(54) INTEGRATED CIRCUIT RELIABILITY ASSESSMENT APPARATUS AND METHOD

(71) Applicant: Intel Corporation, Santa Clara, CA (US)

(72) Inventors: Christopher F. Connor, Hillsboro, OR (US); Bruce Querbach, Hillsboro, OR (US); Gordon McFadden, Hillsboro, OR (US); Rahul Khanna, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/360,899

(22) Filed: Nov. 23, 2016

(51) Int. Cl.
*G06Q 10/06* (2012.01)
*G06Q 10/08* (2012.01)
*G01R 31/28* (2006.01)
*G06F 17/50* (2006.01)

(52) U.S. Cl.
CPC ..... *G01R 31/2851* (2013.01); *G01R 31/2855* (2013.01); *G06F 17/5036* (2013.01)

(58) Field of Classification Search
CPC ............... G06F 11/008; G06F 11/1016; G06F 17/5036; G06Q 10/0635; G01R 31/2851; G01R 31/2855

USPC ............... 702/179, 186, 189; 705/7.28, 36 R
See application file for complete search history.

(56) References Cited

U.S. PATENT DOCUMENTS

| | | | | |
|---|---|---|---|---|
| 2009/0287909 | A1* | 11/2009 | Vera | G06F 11/008 712/220 |
| 2015/0088783 | A1* | 3/2015 | Mun | G06Q 10/04 705/36 R |
| 2015/0248325 | A1* | 9/2015 | Calderbank | G06F 11/1048 714/768 |
| 2015/0281015 | A1* | 10/2015 | Griffith | H04L 43/0817 709/224 |

* cited by examiner

*Primary Examiner* — Jonathan Han
(74) *Attorney, Agent, or Firm* — Nicholson De Vos Webster & Elliott LLP

(57) ABSTRACT

Embodiments detailed herein include an apparatus that includes a reliability assessment engine (RAE) stored in non-volatile memory and processing circuitry to execute the RAE to: receive data of at least one physical condition from a plurality of intra-die variation monitoring circuits, apply the received data least one to at least one reliability physics model, and calculate at least one of an estimated amount of lifetime consumed and an estimated amount of lifetime remaining.

16 Claims, 16 Drawing Sheets

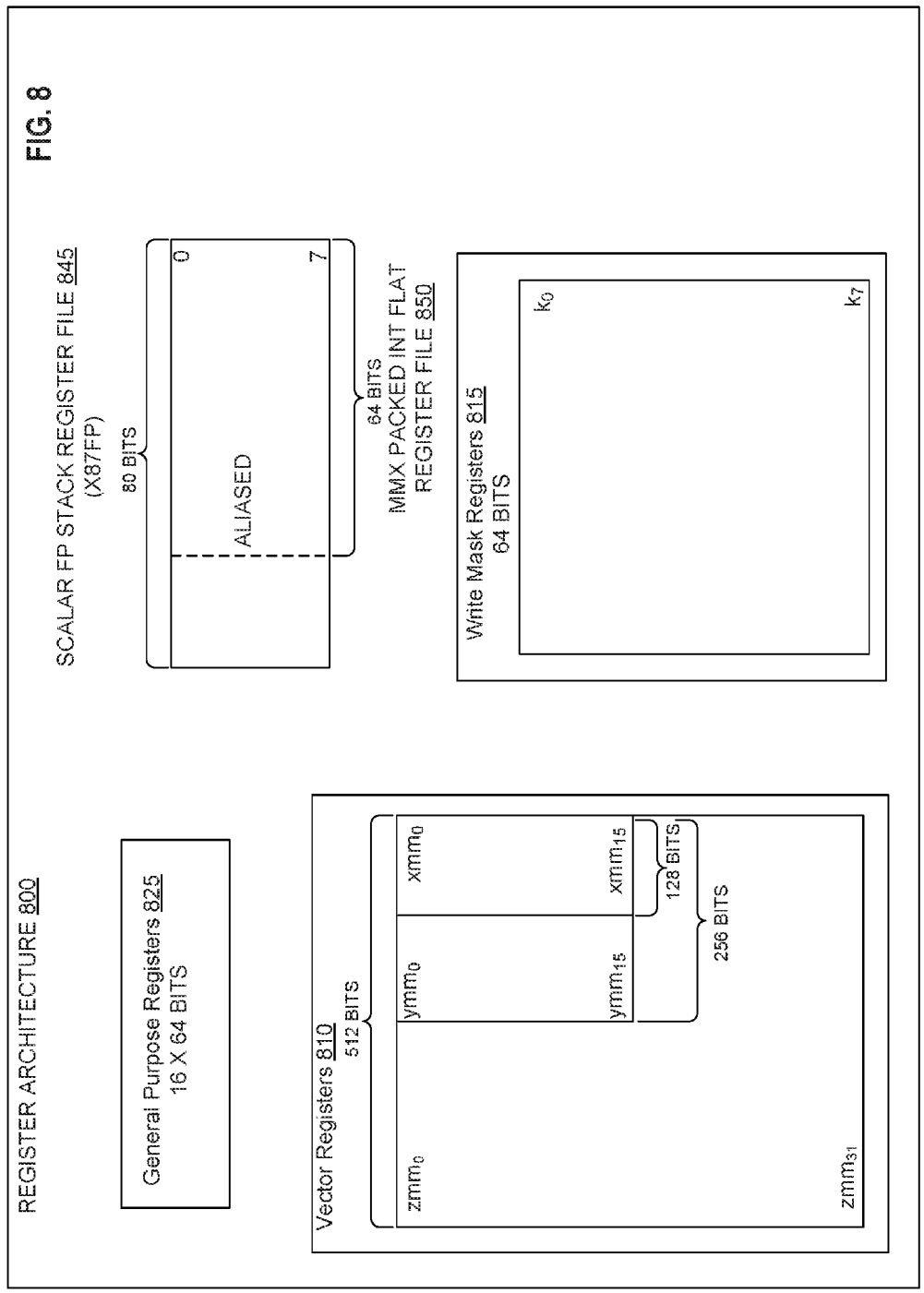

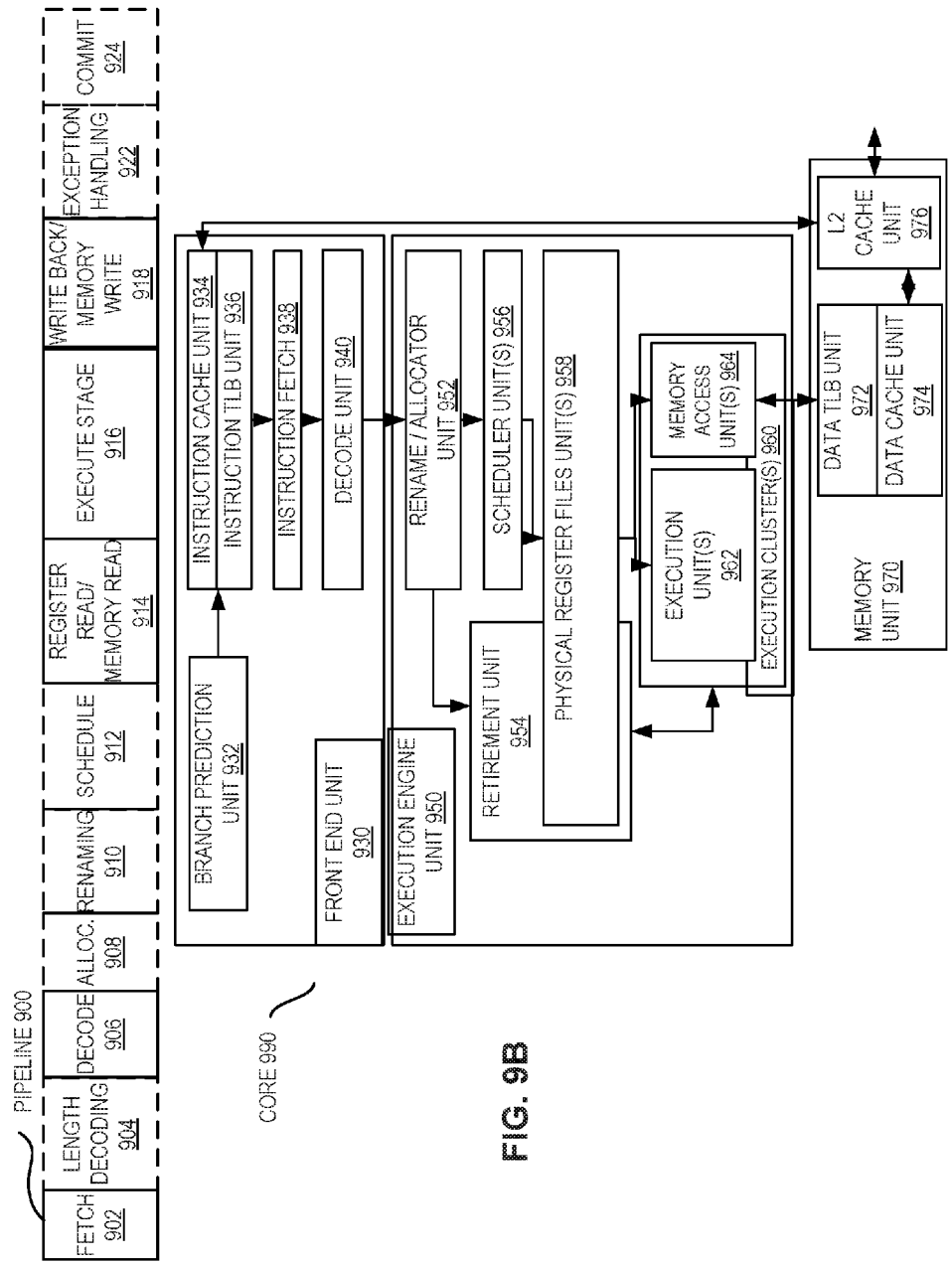

INTEGRATED CIRCUIT RELIABILITY ASSESSMENT APPARATUS AND METHOD

TECHNICAL FIELD

The present disclosure relates to the field of integrated circuit devices, in particular, to reliability assessment of integrated circuit devices.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Reliability physics modeling is used to estimate integrated circuit (IC) projected lifetime under specified operating conditions. Currently, IC chip lifetimes are typically estimated at the time of manufacture and assigned based on operating conditions that may not be exceeded for the estimate to remain valid. This does not take into account actual operating conditions during use of the IC chip and does not allow an end user to understand the effect changed operating conditions may have on projected IC chip lifetime. With no method to assess reliability in real time with respect to actual product use and environmental conditions, extra reliability that may be in the form of additional product lifetime and/or performance may be unused, translating to additional product cost over time.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the Figures of the accompanying drawings.

FIG. 8 is a block diagram of a register architecture 800 according to one embodiment of the invention;

FIG. 9A is a block diagram illustrating both an exemplary in-order pipeline and an exemplary register renaming, out-of-order issue/execution pipeline according to embodiments of the invention;

FIG. 9B is a block diagram illustrating both an exemplary embodiment of an in-order architecture core and an exemplary register renaming, out-of-order issue/execution architecture core to be included in a processor according to embodiments of the invention;

FIG. 10A is a block diagram of a single processor core, along with its connection to the on-die interconnect network 1002 and with its local subset of the Level 2 (L2) cache 1004, according to embodiments of the invention;

FIG. 10B is an expanded view of part of the processor core in FIG. 10A according to embodiments of the invention;

FIG. 12 shown a block diagram of a system in accordance with one embodiment of the present invention;

FIG. 13 is a block diagram of a first more specific exemplary system in accordance with an embodiment of the present invention;

FIG. 14 is a block diagram of a second more specific exemplary system in accordance with an embodiment of the present invention;

FIG. 15 is a block diagram of a SoC in accordance with an embodiment of the present invention.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Detailed herein are embodiments of a "self-aware" reliability capability (life meter) that includes physics models for multiple failure mechanisms. In some embodiments, this capability comes from an engine that monitors and tracks real time activity level, real time voltage, and temperature, and controls maximal voltage and frequency an IC or components thereof can operate at. This effectively gives an end user, or server administrator, a real time "life meter" similar to what a gamer would see at the corner of their screen of the health of their character. This provides the ability to make an informed decision between more performance for shorter life span, or less performance for longer life span.

Figure 1:
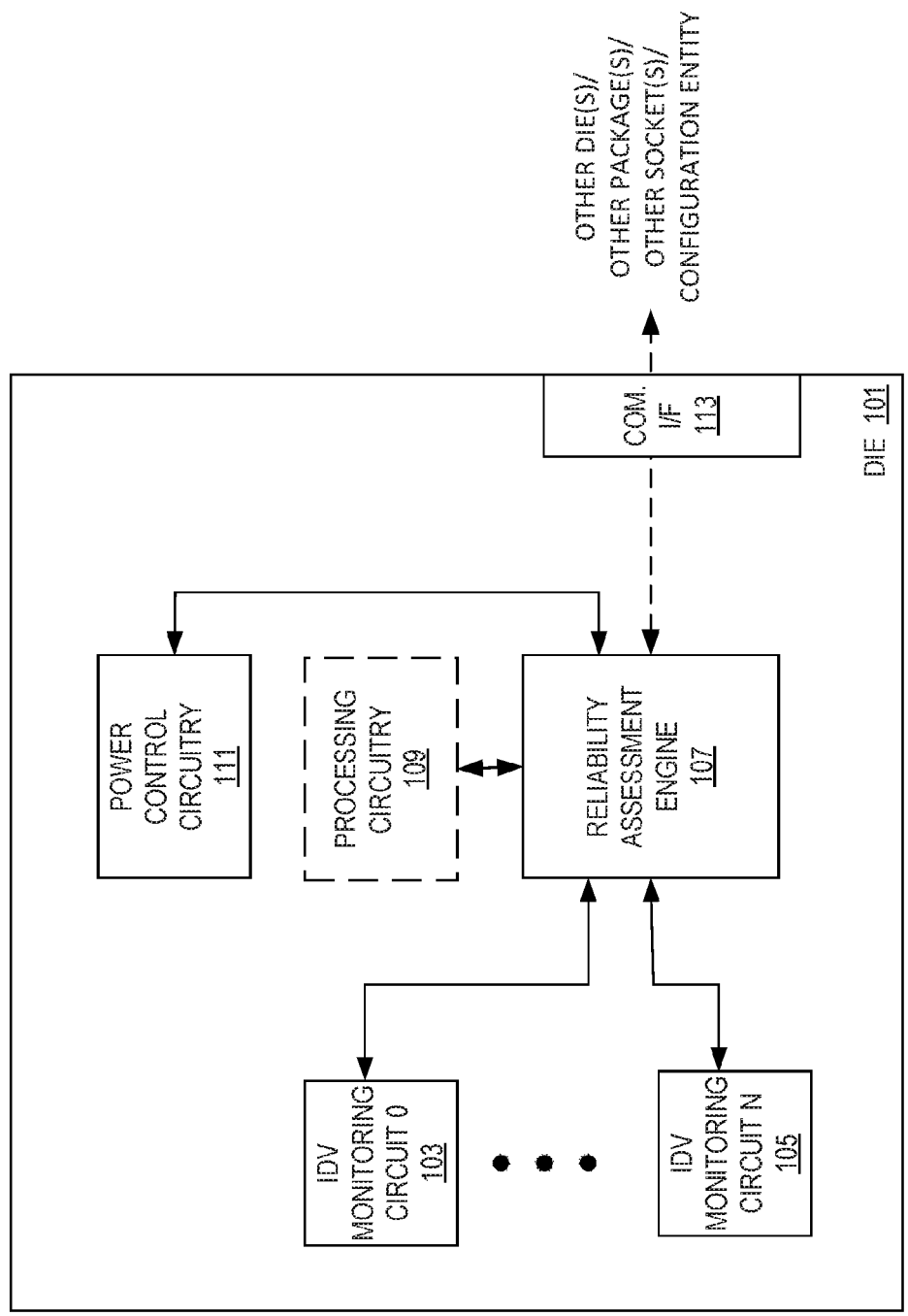
FIG. 1 illustrates an embodiment of a circuit die including an assessment engine (RAE)

FIG. 1 illustrates an embodiment of a circuit die. The die 101 includes a reliability assessment engine (RAE) 107 to assess reliability of one or more components on the die and the die itself. At times, a die may be referred to as an IC.

In some embodiments, the RAE 107 is software and data structures stored in memory (e.g., non-volatile memory) coupled to processing circuitry 109 (e.g., a processor core or a portion thereof) for execution. In other embodiments, the RAE 107 is embodied as circuitry to perform functionality on data structures detailed herein. This circuitry may be a part of a processor core and/or chipset.

The RAE 107 utilizes one or more reliability models to determine reliability and/or life used/remaining of the die 101 and/or components of the die. Typically, the reliability models are a part of the RAE 107 and/or intra-die variation (IDV) monitoring circuits 103-107 (also referred to as test structures and/or fublets). One or more of the physical reliability models may be programmable such that the model evolves such as upon degradations observed in available test structures over time. In various embodiments, models including one or more formulas having one or more variable parameters representing physical IC operating conditions may be stored in memory at a time of IC manufacture. In some embodiments, the models may be updated in a firmware and/or software update process such that one or more revised models may be stored in place of or in addition to the models stored at the time of manufacture. Reliability circuits within an IDV monitoring circuit 103-107 assess temperature, voltage, workload, and therefore reliability, for one or more physics based effects (listed in the table below) with an exception of edge damage monitoring and integrated reliability which encompass whole die.

Physical reliability models are coupled with temperature, voltage, and/or workload observed to compute used reliability and life remaining. Exemplary models include one or more of: a time dependent dielectric breakdown model, a bias temperature stability model, an electromigration model, a negative and positive (negative/positive) bias temperature instability model, an integrated reliability model, an edge damage monitor crack model, fin-self-heat model, etc. as shown in the table below.

| Parameter | Description | Structure Type |
| --- | --- | --- |
| Time dependent dielectric breakdown | Modeling of transistor dielectric lifetime | Gate oxide breakdown |
| Bias temperature stability | Modeling of interconnect lifetime with respect to shorting mechanisms | Bias temperature stability breakdown |
| Electro-migration | Modeling of interconnect lifetime with respect to opens | Current measurement |
| Negative and positive bias temperature instability | Transistor failure mechanism for P and N MOS devices | BTI measurement |
| Integrated reliability | Defect/infant mortality modeling | N/A |
| Edge damage monitor | Modeling fidelity of the silicon guard ring | N/A |
| Fin-self-heat | FISH | Temperature matrix |

Model parameters, as mentioned above, are typically programmed at the point of manufacture. These parameters can be updated as well in real-time to provide a more accurate assessment of survival probability. Each portion die/package/socket is evaluated in this manner with all lifetime evaluations within the reliability assessment module.

In some embodiments, the time dependent dielectric breakdown model models transistor dielectric lifetime, the bias temperature instability model models interconnect lifetime with respect to shorting mechanisms, the electromigration model models interconnect lifetime with respect to open circuits, the negative/positive bias temperature instability model models a transistor failure mechanism for P and N type metal oxide semiconductor (MOS) devices, the integrated reliability model may model defect/infant mortality, the edge damage model models electrical edge damage monitor measurements, and the fin-self-heat model models the thermal energy from current in a FinFET.

In some embodiments, a statistical reliability physics model may use one or more equations to calculate an expected failure rate of an IC. In various embodiments, a defect reliability/infant mortality model, shown as equation (1), may be used in combination with a fail rate equation, shown as equation (2), to calculate an expected failure rate of an IC device.

$$t_{\mathit{eff}} = \sum_{i=\text{states}} t_{\text{readout}} TIS_i DC_i \exp\left[C(V_i - V_{\text{ref}}) - \frac{E_a}{k_b}\left(\frac{1}{T_{\text{use}_i}} - \frac{1}{T_{\text{ref}}}\right)\right] \quad (1)$$

With respect to equation (1): $TIS_i$ is the percent of time spent in state i according to the use model; $DC_i$ is the duty cycle parameter for state i (which may differ from block to block); $V_i$ and $T_i$ are the voltage and temperature for a particular block; $t_{\text{readout}}$ is incremental time; and $k_b$ is the Boltzmann constant.

As shown in equation (2), in various embodiments, two effective stress times may be used to compute fail rate: the effective stress time due to burn-in stress alone, $t_{\mathit{eff}}^{BI}$, and the total effective stress time in burn-in plus use stress, $t_{\mathit{eff}}$. To determine the expected failure rate, equation (2) may be used, where $\Phi$ is the cumulative normal distribution function, $t_{\mathit{eff}}$ is the effective stress time including use and burn-in, $t_{\mathit{eff}}^{BI}$ is the effective stress time in burn-in, $\mu$ is the mean of the natural logarithm of the lifetime distribution, PURDD is per unit defect density, A is the area under consideration, and $\sigma$ is the standard deviation.

$$\langle S \rangle = \frac{S_{\text{cum}}}{S_{BI}} = \left[\frac{1 - \Phi\left(\frac{\ln(t_{\mathit{eff}}) - \mu}{\sigma}\right)}{1 - \Phi\left(\frac{\ln(t_{\mathit{eff}}^{BI}) - \mu}{\sigma}\right)}\right]^{\frac{A \cdot PURFF}{A_{\text{ref}} \cdot D_{\text{ref}}}} \quad (2)$$

Table 1 provides additional information with respect to the parameters of equations (1) and (2), according to various embodiments.

TABLE 1

| Parameter | Description | Units |
|---|---|---|
| $\mu$ | Lognormal mean of the infant mortality lifetime (in hrs) for the reference area at the reference defect density. | Ln(hrs) |
| $\sigma$ | Lognormal standard deviation of the infant mortality lifetime distribution for the reference area at the reference defect density. | |
| $A_{ref}$ | Reference die area. | $cm^2$ |
| $D_{ref}$ | Reference electric field for voltage acceleration | defects/$cm^2$ |
| $T_{ref}$ | Reference temperature for thermal acceleration | C |
| $V_{ref}$ | Reference voltage for voltage acceleration | V |
| C | Voltage acceleration factor. | 1/V |
| $E_a$ | Thermal activation energy | eV |

The RAE 107 is coupled to one or more communication interfaces 113 such that the RAE may transmit and/or receive: 1) parameter data; 2) lifetime data; and/or 3) configurations to/from other die(s), other package(s), other socket(s), and/or a configuration server via a network/communication interface 113. Additionally, results of models and underlying data may be made available to software running on the die 101.

The RAE 107 is coupled to power control circuitry 111 which receives the parameter information and generates output signals to affect the components of the die. Precise controlling of the power output based on the received parameters not only provides more efficient performance, but also prolongs the operational lifespan. In some embodiments, the power control circuitry 111 includes a voltage regulator (VR) controller that receives and processes the parameters passed from the RAE 107. In some embodiments, the power control circuitry 111 includes one or more finite state machines (FSMs), a compensator, and a pulsewidth modulator (PWM). A FSM provides one or more FSMs to control various voltage/current control parameters. The Compensator receives a target voltage from the FSM and compares the target voltage against an actual voltage received from the core that is the subject of the particular state. The PWM generates pulse signals to control current in the components of power converter based on the output of compensator. The frequency of the pulses affects the switching of power transistors (e.g., field effect transistors (FETs)) at one or more stages of power converter. The frequency of the pulses driving the components of power converter affects the current and/or voltage of power signal output by power converter.

Figure 2:
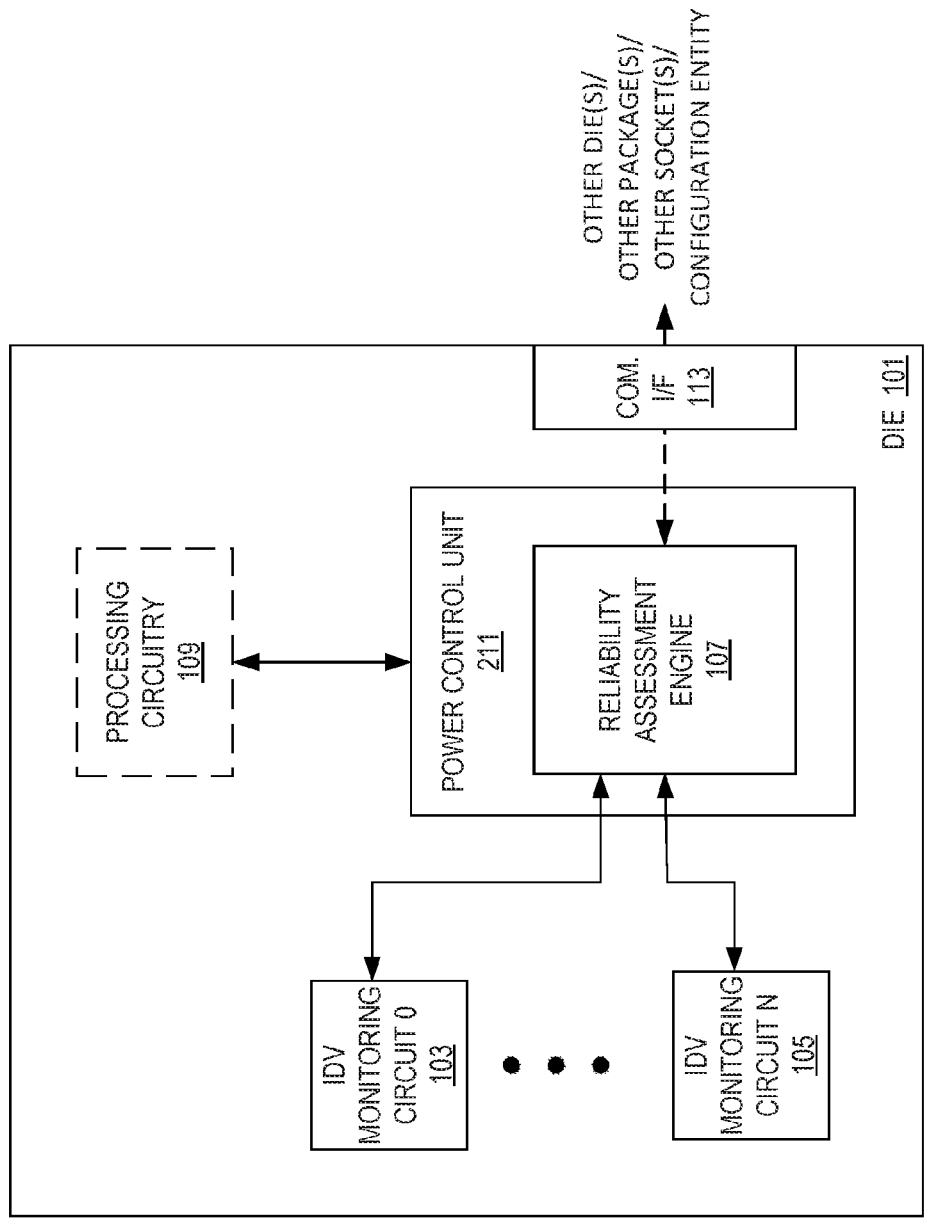
FIG. 2 an embodiment of a circuit die.

FIG. 2 an embodiment of a circuit die. In this embodiment, the RAE 107 is a part of a power control unit 211 which provides the functionality of power control circuitry 111.

Figure 3:
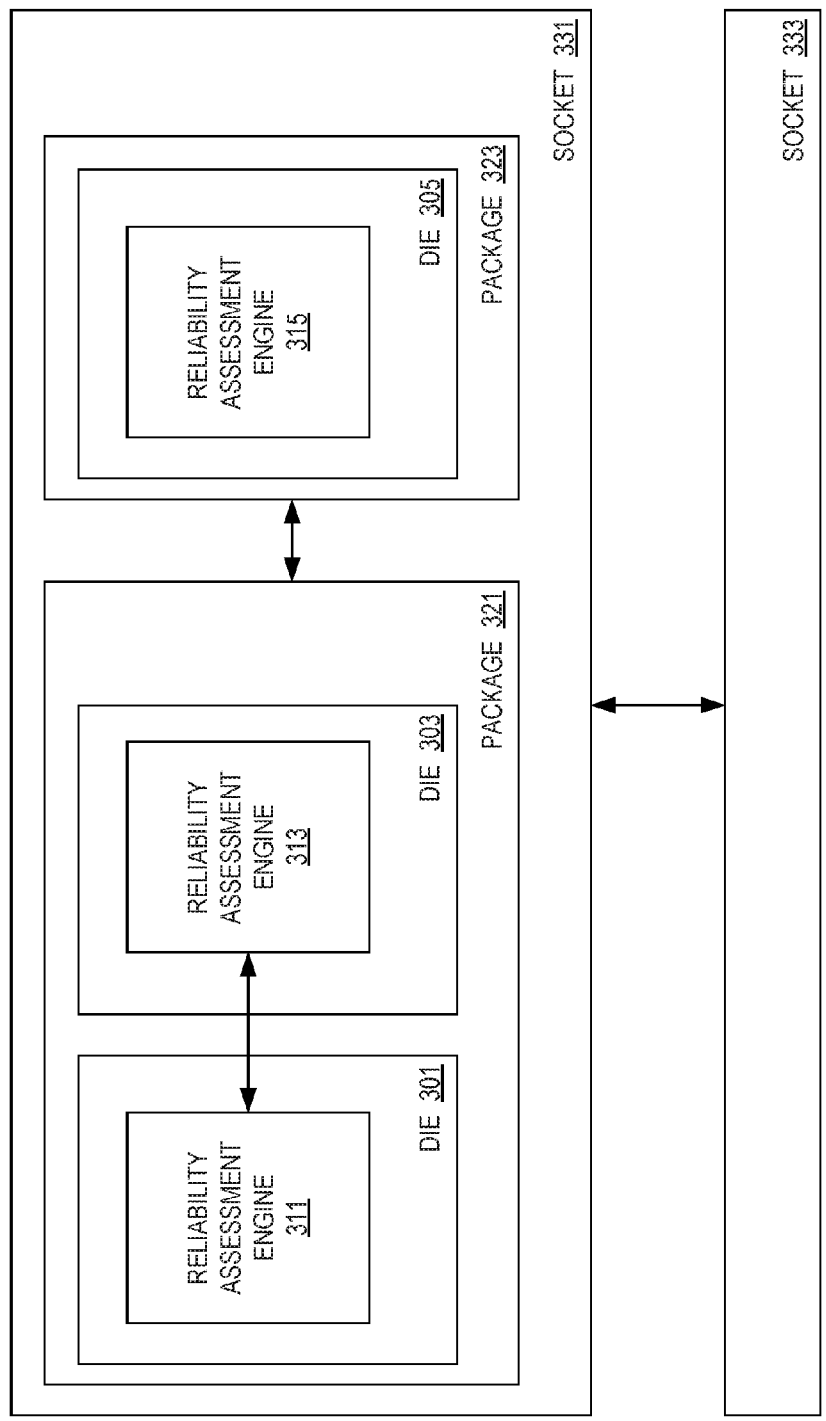
FIG. 3 an embodiment of a system utilizing RAEs.

FIG. 3 an embodiment of a system utilizing RAEs. In some embodiments, this system is a big data processor. As shown, each die 301, 303, 305 includes at least one RAE 311, 313, 315. These RAEs 311, 313, 315 can communicate with each other in the same package (e.g., within package 321), across packages (e.g., between package 321 and package 323), and/or across sockets (e.g., between socket 331 and socket 333). In some embodiments, communication is through the aid of system level software which stores RAE collected data. Sophisticated analytics can be run in the background as a system maintenance process to evaluate overall health of the system over many months and over many years. For example, RAE based analytics can move large computing workloads to the night when outdoor temperature is cooler, and use the cooler temperature to extend silicon life or to boost silicon performance on cooler nights.

Figure 4:
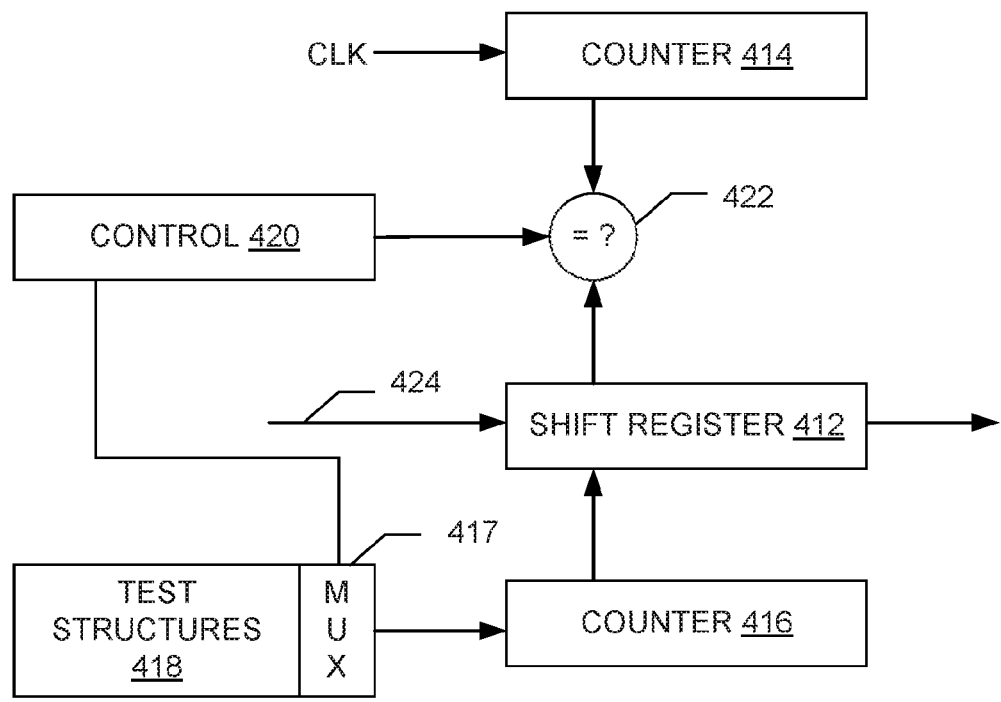
FIG. 4 illustrates an embodiment of a monitoring circuit.

FIG. 4 illustrates an embodiment of a monitoring circuit. This monitoring circuit performs measuring, or extracting, process parameters that characterize the fabrication of integrated circuits in the die. Due to this arrangement, the circuit may be used to extract process parameters even after packaging of the die. In some embodiments of the invention, the process monitoring circuit may be a digital circuit that may use only a few output pins (two, for example) of a semiconductor package. As an example, these output pins may be pre-existing pins that are associated with a test interface.

By fabricating the process monitoring circuit into the die, process metrics are obtained from the die during the debugging or production of a particular integrated circuit. Therefore, for a wafer, the process monitoring circuit may be fabricated into all dies of the wafer, thereby allowing all dies of the wafer to be tested. These tests may be performed, as an example, after the packaging of the dies. Furthermore, as described below, in some embodiments of the invention, the process monitoring circuit may be used to extract process parameters from several regions of a particular die or several regions of a wafer. As can be appreciated from the description herein, the process monitoring circuit permits simple correlation between process and debugging issues, such as speed paths, circuit marginalities, etc. Additionally, these process metrics may be measured with regards to voltage and temperature. By utilizing the extracting parameters at several die locations, independent variation may be gauged. As described below, in some embodiments of the invention, the circuit may be used to characterize such effects as coupling, stacking and contention.

More particularly, in some embodiments, the monitoring circuit includes test circuits, or structures 418, each of which is capable of generating an oscillating signal. In this manner, the frequency of the oscillating signal is influenced by the localized fabrication process (near the test structure 418) that is characterized by fabrication process parameters. Thus, by determining the frequency or frequencies of one or more of the test structures 418, the process monitoring circuit may extract process parameters that characterize the fabrication process near the test structure(s) 418, as described below.

For purposes of measuring the frequencies and selecting the appropriate test structures 418, the process monitoring circuit includes a shift register 412; two counters 414 and 416; decisional logic 422; a control state machine 420; and multiplexing circuitry 417. In some embodiments of the invention, the process monitoring circuit may be used in the following manner to perform a test that includes selecting one of the test structures 418 and measuring the frequency of the oscillating signal that is provided by the selected test structure 418. First, an operator may furnish a signal 424 (to an input terminal of the shift register 412) that indicates a command (a word, for example) to be executed by the process monitoring circuit.

Figure 5:
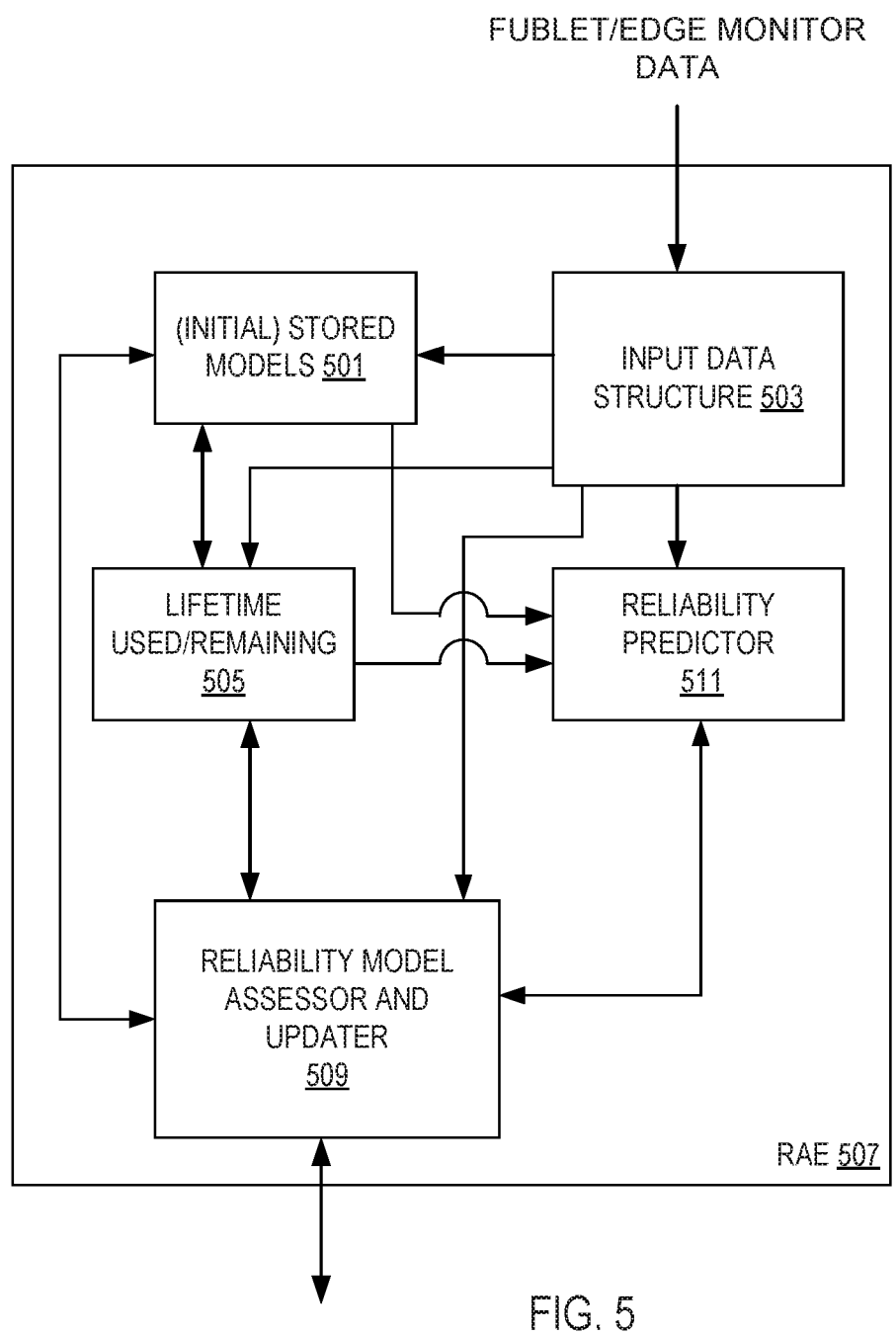
FIG. 5 illustrates an embodiment of a RAE.

FIG. 5 illustrates an embodiment of a RAE. In this illustration, processing circuitry (if present) is not illustrated to ease understanding. While not shown, typically the components detailed here in a stored in non-volatile memory as software or data structures. However, in some embodiments, the RAE 507 is circuitry.

Typically, the RAE 507 includes a plurality of stored reliability physics models 501 (such as those detailed above). In some embodiments, these models 501 are updated as a die, etc. ages. Additionally, alternate models could be imported and utilized.

Lifetime used and/or remaining models 505 provide an indication of an estimated lifetime used or remaining. In various embodiments, the RAE 507 calculates a lifetime of the die that has been consumed under one or more of the reliability physics models 501. The RAE 507 may calculate an amount of lifetime consumed and/or an amount of lifetime remaining for a die using the inputs and one or more reliability physics models 501. In various embodiments, the amount of lifetime consumed, the amount of lifetime remaining, and/or another result generated by the RAE 507 is stored in non-volatile memory in a secure fashion, such as by using an encrypted key. The securely stored results are accessible from outside the RAE 507 as detailed above. In some embodiments, the RAE 507 calculates more than one estimated amount of lifetime remaining based at least in part on the use of different proposed operating parameters such as more than one proposed operating temperature, more than one proposed operating voltage, and/or more than one proposed workload. In some embodiments, a computer may display options to a user so that the user may be able to select among the multiple different proposed operating parameters such that tradeoffs can be made that allow the amount of operating lifetime to be reduced in order to gain additional performance or to be increased when some level of performance is reduced.

A reliability predictor model 511, such as an infant mortality model, is also stored and executed to determine a reliability of a die. In some embodiments where the reliability predictor 511 is a Markov failure prediction model, a failure state of the IC may be estimated by combining Markov chains from multiple components. In some embodiments, a chip with the IC may be modeled as being in a normal, repair, or fail state at a particular point in time. An estimated degradation of the chip may be estimated with a Markov chain that estimates system failure based on combined reliability physics models. In some embodiments, when the system undergoes a change of state at regular time intervals, it may be described by a stochastic process in which the distribution of future states depends on the present state. In various embodiments, the failure rate may be modeled by regressing physics-based reliability measurements that act as fundamental components driving the Markov process. In some embodiments, a statistical model such as a Markov failure prediction model may also be used to model an estimated failure of a device with multiple IC chips, each chip having an integrated RAE 507, based at least in part on results from the reliability physics models from the RAEs in the chips of the device.

In various embodiments, the reliability physics models 501, lifetime used/remain models 505, and the reliability predictor are 511 are stored at the time of production of a device that includes the RAE 507, along with an expected maximum die lifetime parameter. In some embodiments, the reliability physics models 501 may include formulas and/or algorithms that may use one or more inputs that may include one or more sensed voltages, an average of the one or more sensed voltages, one or more sensed temperatures, an average of the one or more sensed temperatures, one or more workload measures, an average of the one or more workload measures, and/or other physical conditions of an die sensed during a period of operation of the IC (e.g., by IDVs). In various embodiments alternative and/or additional inputs, such as area and/or use conditions, are used. In some embodiments, a workload measure is a representation of aggregate use of a particular IC sub-block.

In some embodiments, the models 501, 505, 511—calibrated, as each mechanism is assessed continually with respect to lifetime as well as the rate of degradation versus the applied conditions (voltage, temperature, and workload), using reliability model assessor and updater 509. This allows a RAE 507 to adjust the voltage, temperature, and workload to result in a lower rate of degradation.

In some embodiments, an assessment workload of the die is periodically stored into non-volatile memory of (or accessible by) the RAE 507 along with the voltage and/or temperature experienced by dies while performing the workload. Based on a predefined maximum effective stress at a given time, the processor coupled with the RAE 507 may cause and output of controls for regulation of the voltage, temperature, and/or workload of the IC based on the actual effective stress, while ensuring that a device having the RAE 507 does not exceed the maximum possible stress at a given point in time. For example, power control circuitry is directed to reduce voltage, etc. In various embodiments, a power control unit (PCU) of the die writes workload, voltage, and temperature for each sub-component of a die. Reliability metrics may be calculated and aggregated at a less frequent rate than parameters are stored in some embodiments. The RAE 507 may provide updates to an operating system (OS), reliability, availability, and serviceability (RAS), and/or manageability engine (ME) components of the die, on cumulative reliability lifetime in a variety of metrics. In embodiments, real-time consumption metrics may be extracted and viewed by an administrator of a system having the integrally assessed die. In some embodiments, the RAE 507 itself, or the die has onboard memory for warranty verification with respect to voltage, temperature, and workload of the IC or some or all possible sub-blocks of the IC made available. A user may then utilize the IC for a longer lifetime than originally intended if user conditions were less harsh, or a user may utilize the IC under harsh conditions that extract performance above specified operating parameters.

An input data structure 503 stores data input to the physics models 501, lifetime/used remaining calculation model(s) 505, the reliability predictor 511, and/or a relatability model assessor and updater 509.

Figure 6:
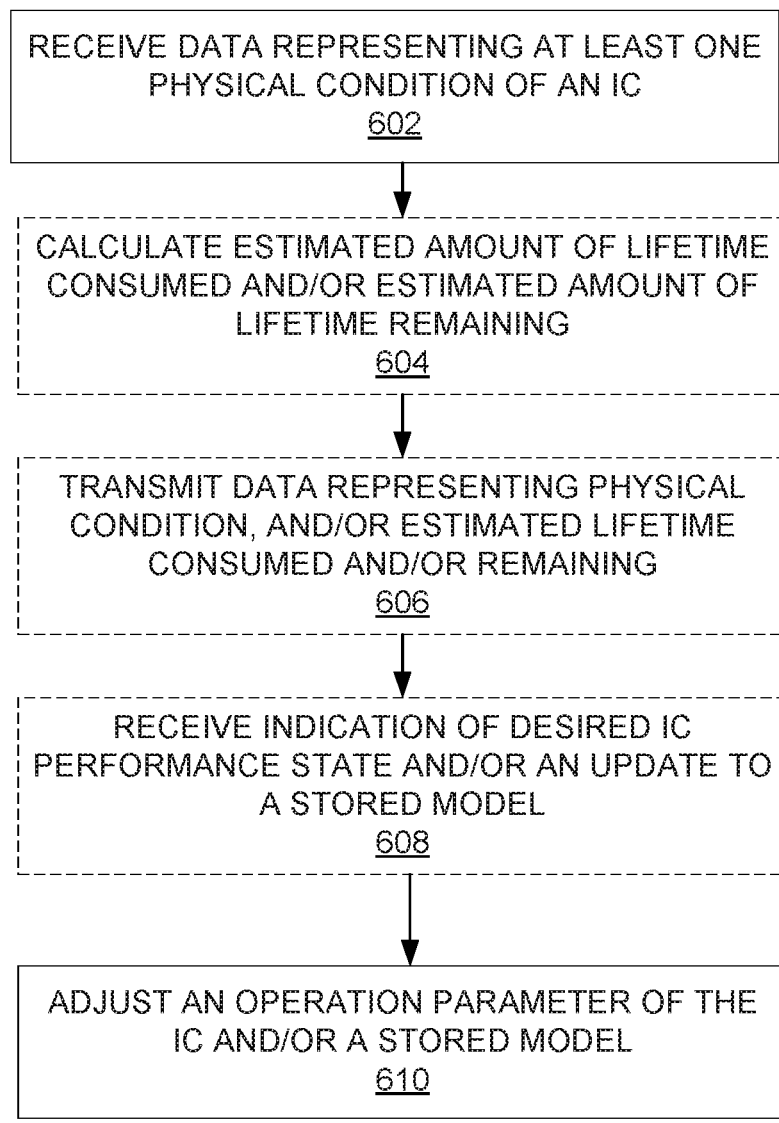
FIG. 6 is a flow diagram of an example of a method of assessing reliability that is implemented on a RAE described herein, in accordance with various embodiments.

FIG. 6 is a flow diagram of an example of a method of assessing reliability that is implemented on a RAE described herein, in accordance with various embodiments.

At 602, data representing at least one physical condition of an die is received. For example, information from at least one IDV is received by the RAE. In various embodiments, the data may represent at least one physical condition of the die sensed during, or at the end of, a period of operation of the die. The sensed physical condition may include sensed voltage, an average of sensed voltage, sensed temperature, an average of sensed temperature, a workload measure, an average of a workload measure, and/or other conditions of the die.

In some embodiments, at 604, an estimated amount of lifetime consumed and/or an estimated amount of lifetime remaining for the die is calculated based at least in part on a reliability physics model and the received data. In some embodiments, the calculation may be performed using two or more reliability physics models and a statistical model to combine the two or more reliability physics models. In various embodiments, the reliability physics models used in the calculation include one or more of a time dependent dielectric breakdown model, a bias temperature stability model, an electromigration model, a negative and positive (negative/positive) bias temperature instability model, an integrated reliability model, an edge damage monitor crack model, fin-self-heat model. In some embodiments, more than one estimated amount of die lifetime remaining may be calculated based on differing proposed operating parameters.

In some embodiments, at 606, the received data representing at least one physical condition of an die and/or a calculated estimated amount of lifetime consumed and/or an estimated amount of lifetime remaining is transmitted to another entity. For example, the RAE transmits or makes available one or more of these items to another RAE on die, another RAE off die, an operating system (OS), reliability, availability, and serviceability (RAS), and/or manageability engine (ME) components of the die.

In some embodiments, at 608, an indication of a desired IC performance state is received. The indication may be received from a user based on a selection between estimated amount of die lifetime remaining based on differing operating parameter scenarios or may be received from a RRSAC, for example.

At 610, an operation parameter of the die is adjusted based at least in part on the received indication. In various embodiments, the operating parameter adjusted may include one or more of a temperature, a voltage, or a workload of the die, for example.

Figure 7:
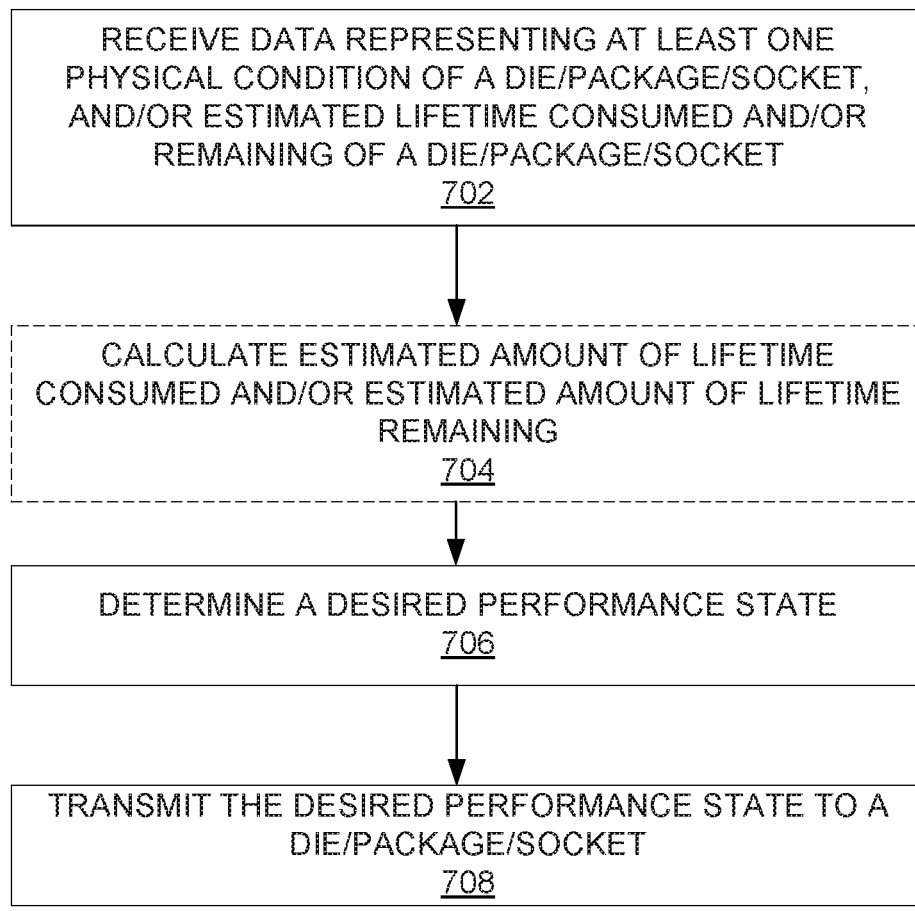
FIG. 7 is a flow diagram of an example of a method of causing a performance state change in accordance with various embodiments.

FIG. 7 is a flow diagram of an example of a method of causing a performance state change in accordance with various embodiments. In some embodiments, this method is performed by one or more of an operating system (OS), reliability, availability, and serviceability (RAS), and/or manageability engine (ME) components of a die.

At 702, data representing at least one physical condition of an die is received. For example, information from at least one IDV is received from a RAE. In various embodiments, the data may represent at least one physical condition of the die sensed during, or at the end of, a period of operation of the die. The sensed physical condition may include sensed voltage, an average of sensed voltage, sensed temperature, an average of sensed temperature, a workload measure, an average of a workload measure, and/or other conditions of the die.

In some embodiments, at 704, an estimated amount of lifetime consumed and/or an estimated amount of lifetime remaining for the die is calculated based at least in part on a reliability physics model and the received data. In some embodiments, the calculation may be performed using two or more reliability physics models and a statistical model to combine the two or more reliability physics models. In various embodiments, the reliability physics models used in the calculation include one or more of a time dependent dielectric breakdown model, a bias temperature stability model, an electromigration model, a negative and positive (negative/positive) bias temperature instability model, an integrated reliability model, an edge damage monitor crack model, fin-self-heat model. In some embodiments, more than one estimated amount of die lifetime remaining may be calculated based on differing proposed operating parameters.

At 706, an indication of a desired performance state is determined. In some embodiments, this performance state is automatically determined based upon input criteria (e.g., how long the part should live, external temperature, time of day, etc.). In other embodiments, a desired performance state is received from a user based on a selection between estimated amount of die lifetime remaining based on differing operating parameter.

At 708, an operation parameter of the die is transmitted to the die/package/socket based at least in part on the indication. In various embodiments, the operating parameter adjusted may include one or more of a temperature, a voltage, or a workload of the die, for example.

The figures below detail exemplary architectures and systems to implement embodiments of the above.

Exemplary embodiments include an apparatus comprising a reliability assessment engine (RAE) stored in non-volatile memory, and processing circuitry to execute the RAE to: receive data of at least one physical condition from a plurality of intra-die variation monitoring circuits, apply the received data least one to at least one reliability physics model; and calculate at least one of an estimated amount of lifetime consumed and an estimated amount of lifetime remaining.

In some embodiments, one or more of the following apply: the reliability physics model includes at least one of a time dependent dielectric breakdown model, a bias temperature stability model, an electromigration model, a negative/positive bias temperature model, an integrated reliability model, an edge damage monitor, a statistical model, and a fin-self-heat model; the statistical model comprises a Markov failure prediction model; the data of at least one physical condition sensed during a period of operation includes one or more sensed voltages, average of the one or more sensed voltages, one or more sensed temperatures, average of the one or more sense temperatures, one or more workload measures, or average of the one or more workload measures; the RAE is part of power control circuitry; the RAE to further adjust an operation parameter based at least in part on the calculated amount of lifetime remaining; the RAE is to receive an indication of a desired performance state and adjust an operation parameter of the integrated circuit based at least in part on the received indication such that at least one of an average voltage, average temperature, or average workload metric is within a desired range; a network interface communicatively coupled to the RAE to transmit and receive information to other RAEs; and/or the RAE to select a reliability physics model from the plurality of reliability physics models.

Exemplary embodiments include a method comprising receiving data representing at least one physical condition of an integrated circuit, calculating an estimated amount of lifetime remaining of the integrated circuit using at least one on-die reliability physics model, and adjusting an operating parameter of the integrated circuit based on the calculated estimated amount of lifetime remaining of the integrated circuit.

In some embodiments, one or more of the following apply: the reliability physics model includes at least one of a time dependent dielectric breakdown model, a bias temperature stability model, an electromigration model, a negative/positive bias temperature model, an integrated reliability model, an edge damage monitor, a statistical model, and a fin-self-heat model; the statistical model comprises a Markov failure prediction model; the data of at least one physical condition includes one or more sensed voltages, average of the one or more sensed voltages, one or more sensed temperatures, average of the one or more sense temperatures, one or more workload measures, or average of the one or more workload measures; updating at least one of the on-die reliability physics models, the operating parameter is adjusted such that at least one of an average voltage, average temperature, or average workload metric is within a desired range; and/or calculating an estimated amount of lifetime consumed for the integrated circuit.

Exemplary embodiments include a method comprising receiving data representing at least one physical condition of an integrated circuit and a calculation related to a lifetime of the integrated circuit, determining a desired performance state for the integrated circuit, and transmitting information about the desired performance state to a die having the integrated circuit, whereby an operating parameter of the integrated circuit is adjusted to fit the desired performance state.

In some embodiments, one or more of the following apply: the calculation related to a lifetime of the integrated circuit is based on a reliability physics model; the reliability physics model is one or more of a time dependent dielectric breakdown model, a bias temperature stability model, an electromigration model, a negative/positive bias temperature model, an integrated reliability model, an edge damage monitor, a statistical model, and a fin-self-heat model; and/or the data of at least one physical condition includes one or more sensed voltages, average of the one or more sensed voltages, one or more sensed temperatures, average of the one or more sense temperatures, one or more workload measures, or average of the one or more workload measures.

Exemplary Register Architecture

FIG. 8 is a block diagram of a register architecture 800 according to one embodiment of the invention. In the embodiment illustrated, there are 32 vector registers 810 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15

Write mask registers 815—in the embodiment illustrated, there are 8 write mask registers (k0 through k7), each 64 bits in size. In an alternate embodiment, the write mask registers 815 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 825—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 845, on which is aliased the MMX packed integer flat register file 850—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-Of-Order Core Block Diagram

FIG. 9A is a block diagram illustrating both an exemplary in-order pipeline and an exemplary register renaming, out-of-order issue/execution pipeline according to embodiments of the invention. FIG. 9B is a block diagram illustrating both an exemplary embodiment of an in-order architecture core and an exemplary register renaming, out-of-order issue/execution architecture core to be included in a processor according to embodiments of the invention. The solid lined boxes in FIGS. 9A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 9A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 9B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression engine, coprocessor core, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (or decoder) may decode instructions, and generate as an output one or more micro-operations, micro-code entry points, microinstructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a write mask registers unit, and a scalar registers unit. These register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 934/974 and a shared L2 cache unit 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 10B:
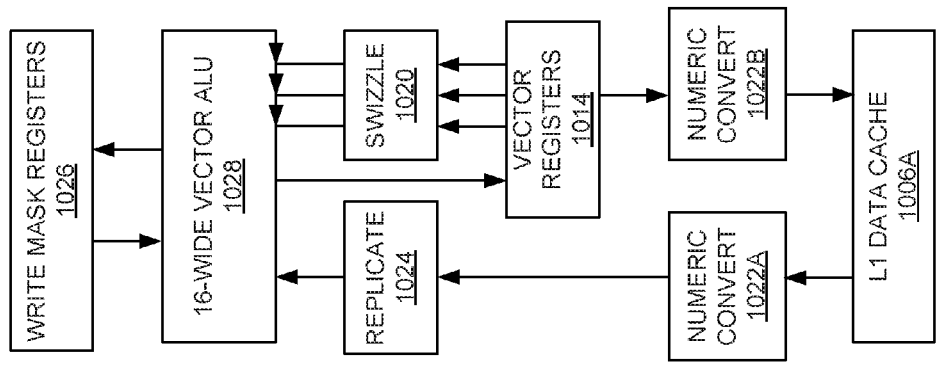
FIGS. 10A-B illustrate a block diagram of a more specific exemplary in-order core architecture, which core would be one of several logic blocks (including other cores of the same type and/or different types) in a chip.
Figure 10A:
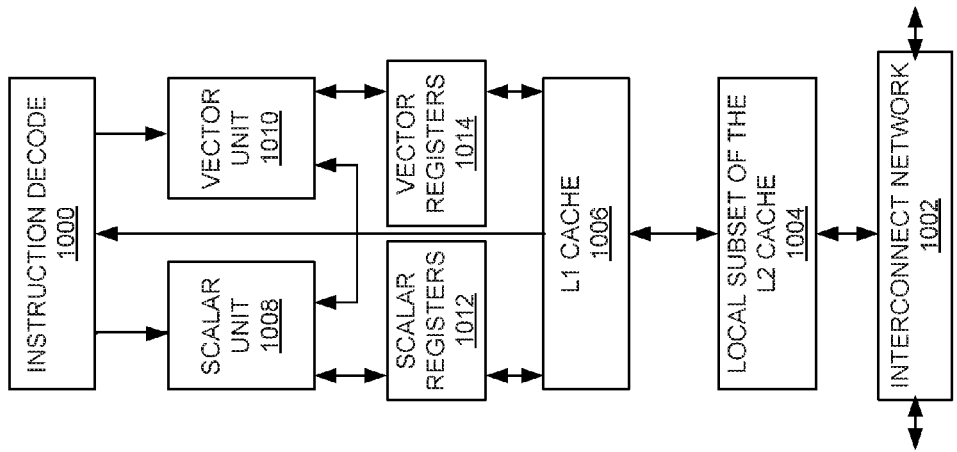

FIGS. 10A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 10A is a block diagram of a single processor core, along with its connection to the on-die interconnect network 1002 and with its local subset of the Level 2 (L2) cache 1004, according to embodiments of the invention. In one embodiment, an instruction decoder 1000 supports the x86 instruction set with a packed data instruction set extension. An L1 cache 1006 allows low-latency accesses to cache memory into the scalar and vector units. While in one embodiment (to simplify the design), a scalar unit 1008 and a vector unit 1010 use separate register sets (respectively, scalar registers 1012 and vector registers 1014) and data transferred between them is written to memory and then read back in from a level 1 (L1) cache 1006, alternative embodiments of the invention may use a different approach (e.g., use a single register set or include a communication path that allow data to be transferred between the two register files without being written and read back).

The local subset of the L2 cache 1004 is part of a global L2 cache that is divided into separate local subsets, one per processor core. Each processor core has a direct access path to its own local subset of the L2 cache 1004. Data read by a processor core is stored in its L2 cache subset 1004 and can be accessed quickly, in parallel with other processor cores accessing their own local L2 cache subsets. Data written by a processor core is stored in its own L2 cache subset 1004 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 10B is an expanded view of part of the processor core in FIG. 10A according to embodiments of the invention. FIG. 10B includes an L1 data cache 1006A part of the L1 cache 1004, as well as more detail regarding the vector unit 1010 and the vector registers 1014. Specifically, the vector unit 1010 is a 16-wide vector processing unit (VPU) (see the 16-wide ALU 1028), which executes one or more of integer, single-precision float, and double-precision float instructions. The VPU supports swizzling the register inputs with swizzle unit 1020, numeric conversion with numeric convert units 1022A-B, and replication with replication unit 1024 on the memory input. Write mask registers 1026 allow predicating resulting vector writes.

Figure 11:
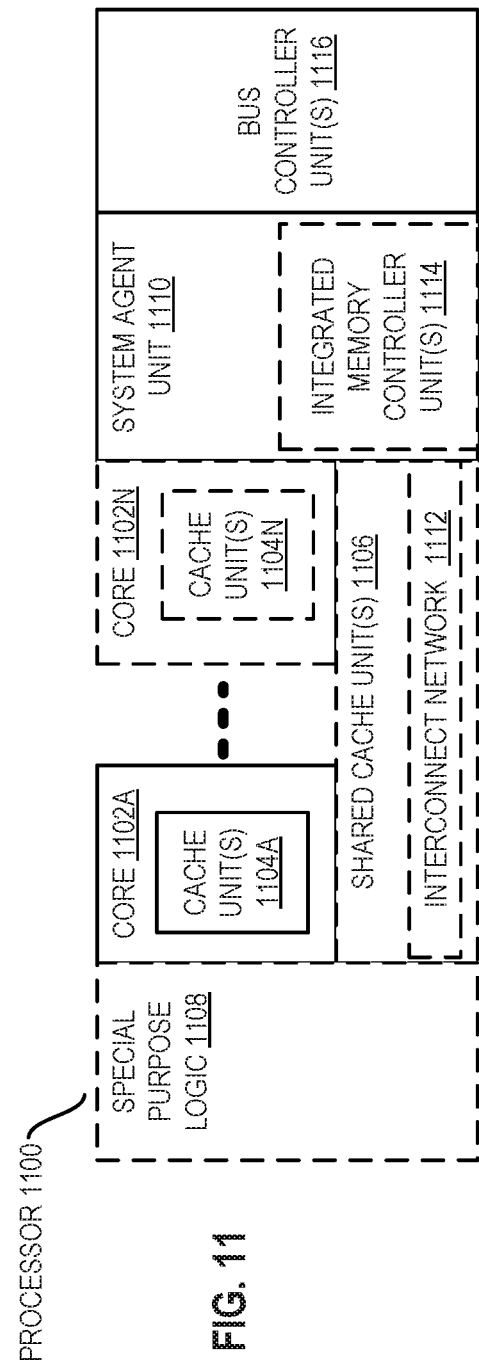
FIG. 11 is a block diagram of a processor 1100 that may have more than one core, may have an integrated memory controller, and may have integrated graphics according to embodiments of the invention.

FIG. 11 is a block diagram of a processor 1100 that may have more than one core, may have an integrated memory controller, and may have integrated graphics according to embodiments of the invention. The solid lined boxes in FIG. 11 illustrate a processor 1100 with a single core 1102A, a system agent 1110, a set of one or more bus controller units 1116, while the optional addition of the dashed lined boxes illustrates an alternative processor 1100 with multiple cores 1102A-N, a set of one or more integrated memory controller unit(s) 1114 in the system agent unit 1110, and special purpose logic 1108.

Thus, different implementations of the processor 1100 may include: 1) a CPU with the special purpose logic 1108 being integrated graphics and/or scientific (throughput) logic (which may include one or more cores), and the cores 1102A-N being one or more general purpose cores (e.g., general purpose in-order cores, general purpose out-of-order cores, a combination of the two); 2) a coprocessor with the cores 1102A-N being a large number of special purpose cores intended primarily for graphics and/or scientific (throughput); and 3) a coprocessor with the cores 1102A-N being a large number of general purpose in-order cores. Thus, the processor 1100 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1100 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof. While in one embodiment a ring based interconnect unit 1112 interconnects the integrated graphics logic 1108 (integrated graphics logic 1108 is an example of and is also referred to herein as special purpose logic), the set of shared cache units 1106, and the system agent unit 1110/integrated memory controller unit(s) 1114, alternative embodiments may use any number of well-known techniques for interconnecting such units. In one embodiment, coherency is maintained between one or more cache units 1106 and cores 1102-A-N.

In some embodiments, one or more of the cores 1102A-N are capable of multi-threading. The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the integrated graphics logic 1108. The display unit is for driving one or more externally connected displays.

The cores 1102A-N may be homogenous or heterogeneous in terms of architecture instruction set; that is, two or more of the cores 1102A-N may be capable of execution the same instruction set, while others may be capable of executing only a subset of that instruction set or a different instruction set.

Exemplary Computer Architectures

FIGS. 12-15 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 12:
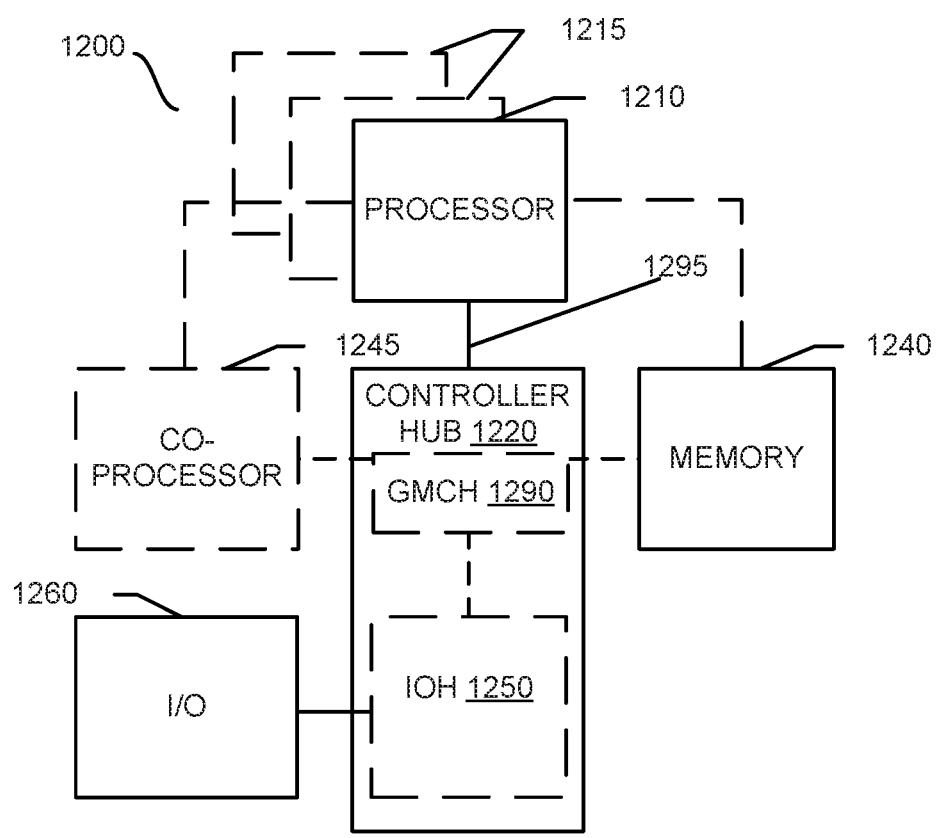
FIGS. 12-15 are block diagrams of exemplary computer architectures.

Referring now to FIG. 12, shown is a block diagram of a system 1200 in accordance with one embodiment of the present invention. The system 1200 may include one or more processors 1210, 1215, which are coupled to a controller hub 1220. In one embodiment the controller hub 1220 includes a graphics memory controller hub (GMCH) 1290 and an Input/Output Hub (IOH) 1250 (which may be on separate chips); the GMCH 1290 includes memory and graphics controllers to which are coupled memory 1240 and a coprocessor 1245; the IOH 1250 couples input/output (I/O) devices 1260 to the GMCH 1290. Alternatively, one or both of the memory and graphics controllers are integrated within the processor (as described herein), the memory 1240 and the coprocessor 1245 are coupled directly to the processor 1210, and the controller hub 1220 in a single chip with the IOH 1250.

The optional nature of additional processors 1215 is denoted in FIG. 12 with broken lines. Each processor 1210, 1215 may include one or more of the processing cores described herein and may be some version of the processor 1100.

The memory 1240 may be, for example, dynamic random access memory (DRAM), phase change memory (PCM), or a combination of the two. For at least one embodiment, the controller hub 1220 communicates with the processor(s) 1210, 1215 via a multi-drop bus, such as a frontside bus (FSB), point-to-point interface such as QuickPath Interconnect (QPI), or similar connection 1295.

In one embodiment, the coprocessor 1245 is a special-purpose processor, such as, for example, a high-throughput MIC processor, a network or communication processor, compression engine, graphics processor, GPGPU, embedded processor, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor(s) 1245 accept and execute the received coprocessor instructions.

Figure 13:
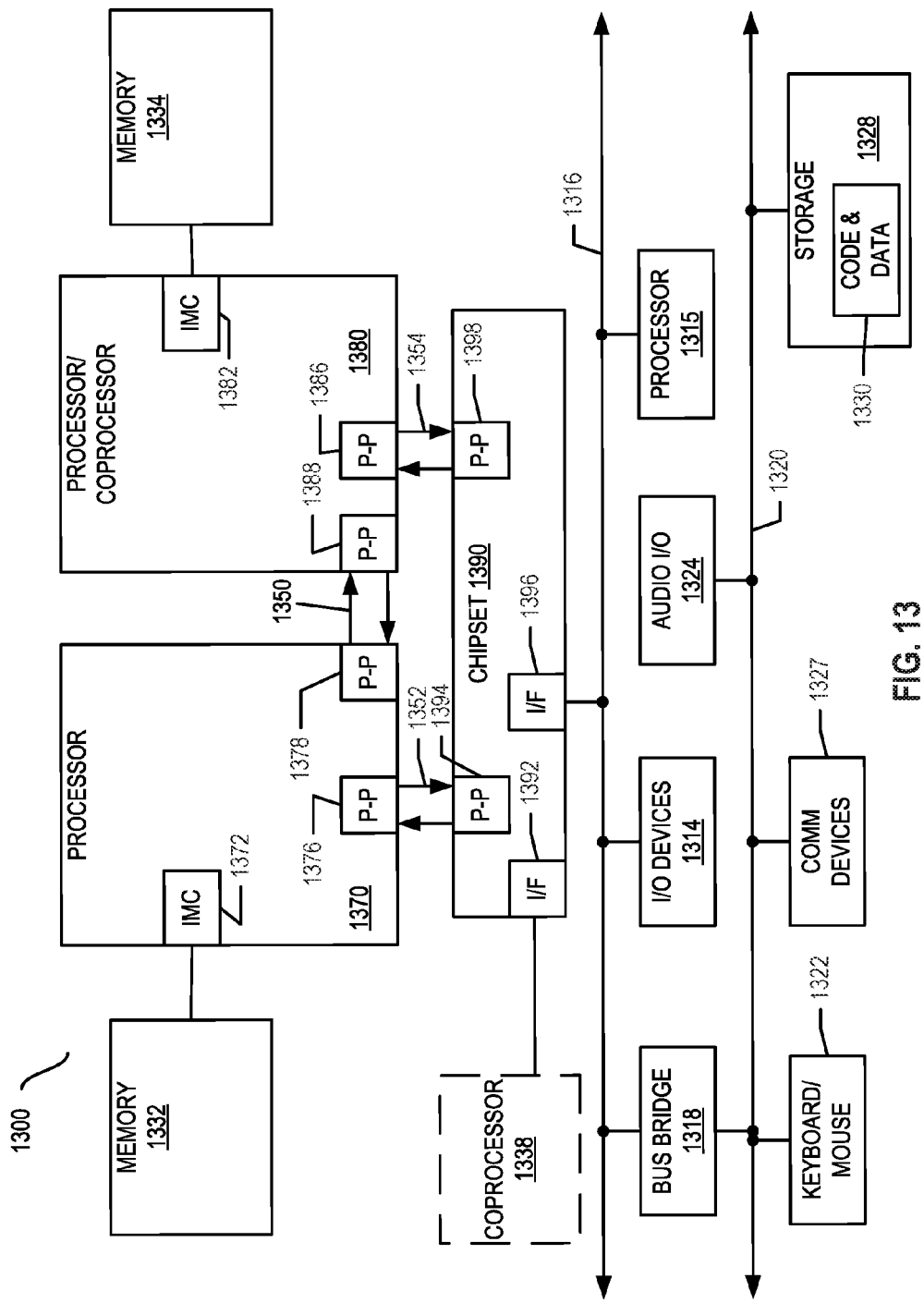

Referring now to FIG. 13, shown is a block diagram of a first more specific exemplary system 1300 in accordance with an embodiment of the present invention. As shown in FIG. 13, multiprocessor system 1300 is a point-to-point interconnect system, and includes a first processor 1370 and a second processor 1380 coupled via a point-to-point interconnect 1350. Each of processors 1370 and 1380 may be some version of the processor 1100. In one embodiment of the invention, processors 1370 and 1380 are respectively processors 1210 and 1215, while coprocessor 1338 is coprocessor 1245. In another embodiment, processors 1370 and 1380 are respectively processor 1210 coprocessor 1245.

Processors 1370 and 1380 are shown including integrated memory controller (IMC) units 1372 and 1382, respectively. Processor 1370 also includes as part of its bus controller units point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 13, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1392. In one embodiment, the coprocessor 1338 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present invention is not so limited.

As shown in FIG. 13, various I/O devices 1314 may be coupled to first bus 1316, along with a bus bridge 1318 which couples first bus 1316 to a second bus 1320. In one embodiment, one or more additional processor(s) 1315, such as coprocessors, high-throughput MIC processors, GPGPU's, accelerators (such as, e.g., graphics accelerators or digital signal processing (DSP) units), field programmable gate arrays, or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a storage unit 1328 such as a disk drive or other mass storage device which may include instructions/code and data 1330, in one embodiment. Further, an audio I/O 1324 may be coupled to the second bus 1320. Note that other architectures are possible. For example, instead of the point-to-point architecture of FIG. 13, a system may implement a multi-drop bus or other such architecture.

Figure 14:
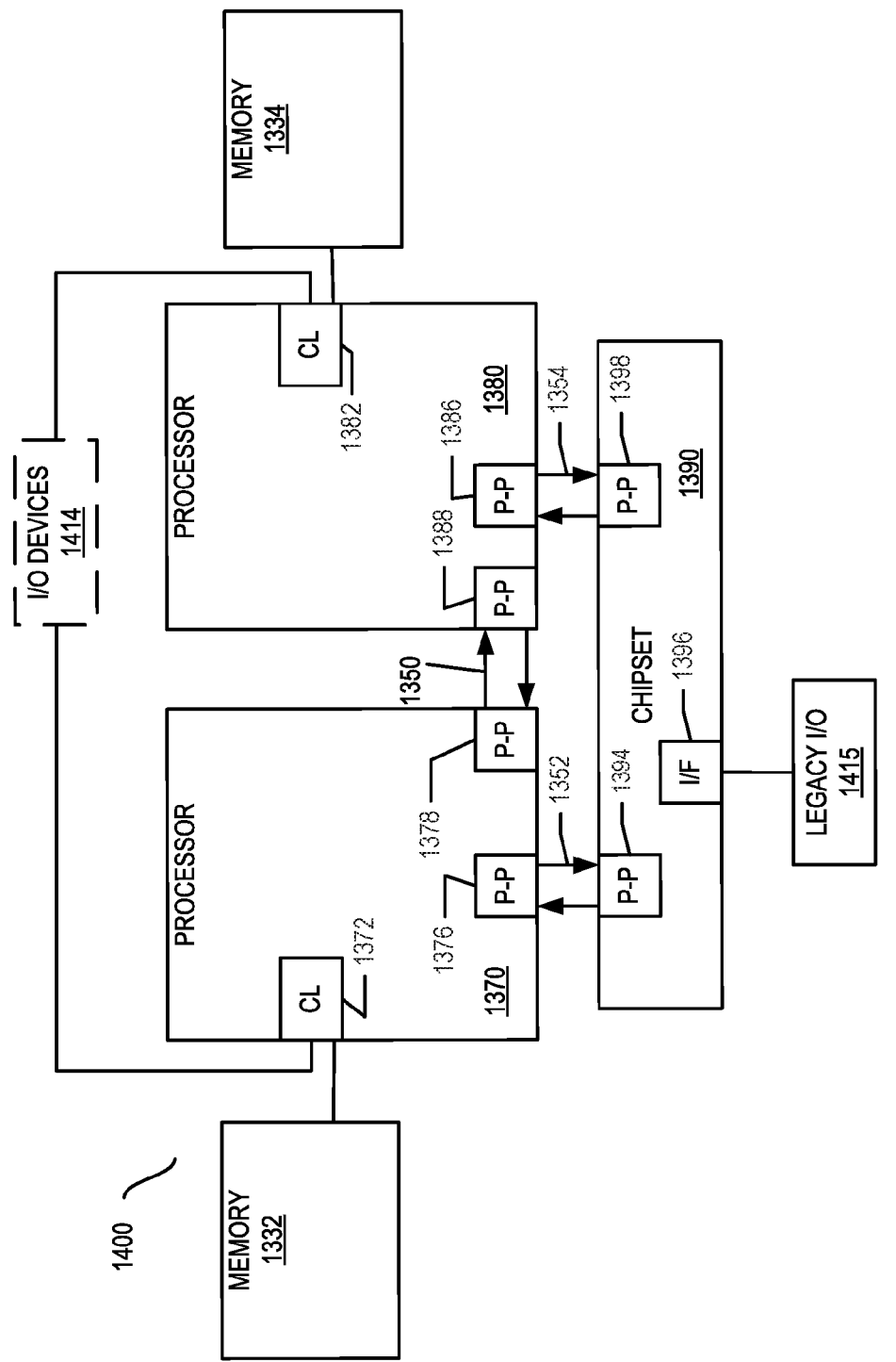

Referring now to FIG. 14, shown is a block diagram of a second more specific exemplary system 1400 in accordance with an embodiment of the present invention. Like elements in FIGS. 13 and 14 bear like reference numerals, and certain aspects of FIG. 13 have been omitted from FIG. 14 in order to avoid obscuring other aspects of FIG. 14.

FIG. 14 illustrates that the processors 1370, 1380 may include integrated memory and I/O control logic ("CL") 1372 and 1382, respectively. Thus, the CL 1372, 1382 include integrated memory controller units and include I/O control logic. FIG. 14 illustrates that not only are the memories 1332, 1334 coupled to the CL 1372, 1382, but also that I/O devices 1414 are also coupled to the control logic 1372, 1382. Legacy I/O devices 1415 are coupled to the chipset 1390.

Figure 15:
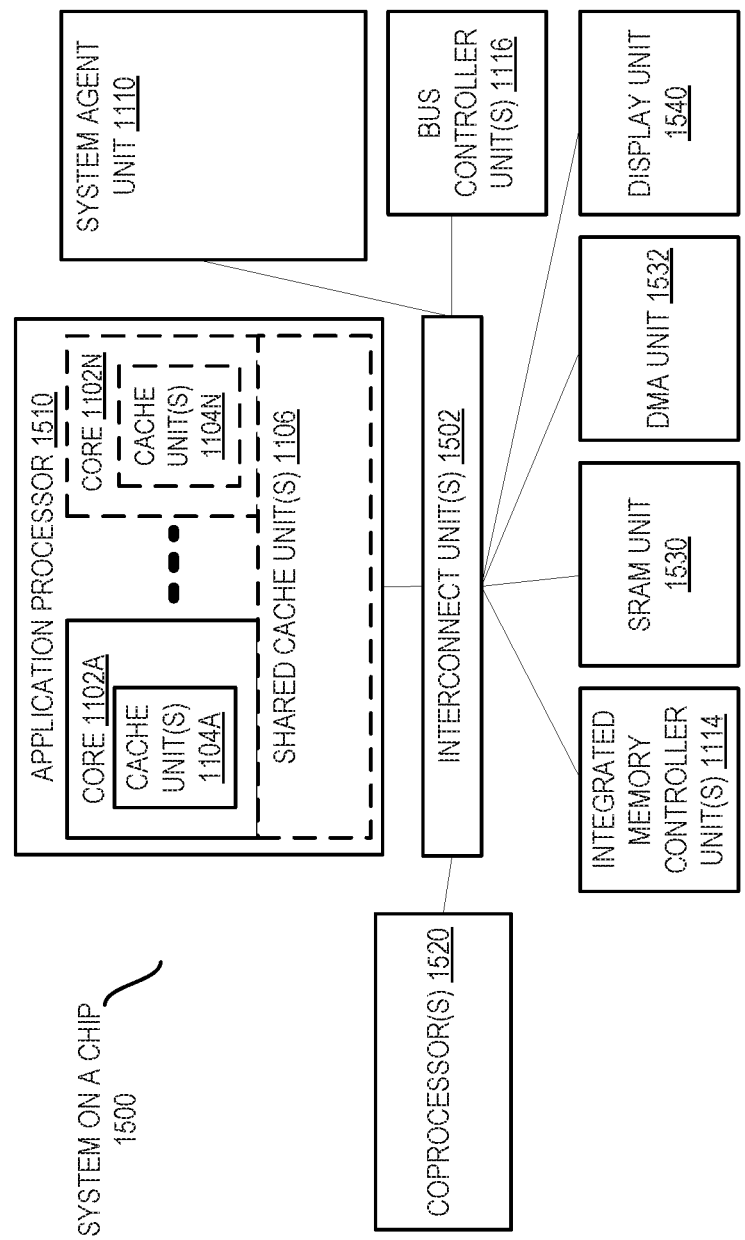

Referring now to FIG. 15, shown is a block diagram of a SoC 1500 in accordance with an embodiment of the present invention. Similar elements in FIG. 11 bear like reference numerals. Also, dashed lined boxes are optional features on more advanced SoCs. In FIG. 15, an interconnect unit(s) 1502 is coupled to: an application processor 1510 which includes a set of one or more cores 1102A-N, which include cache units 1104A-N, and shared cache unit(s) 1106; a system agent unit 1110; a bus controller unit(s) 1116; an integrated memory controller unit(s) 1114; a set or one or more coprocessors 1520 which may include integrated graphics logic, an image processor, an audio processor, and a video processor; an static random access memory (SRAM) unit 1530; a direct memory access (DMA) unit 1532; and a display unit 1540 for coupling to one or more external displays. In one embodiment, the coprocessor(s) 1520 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1330 illustrated in FIG. 13, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMS) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 16:
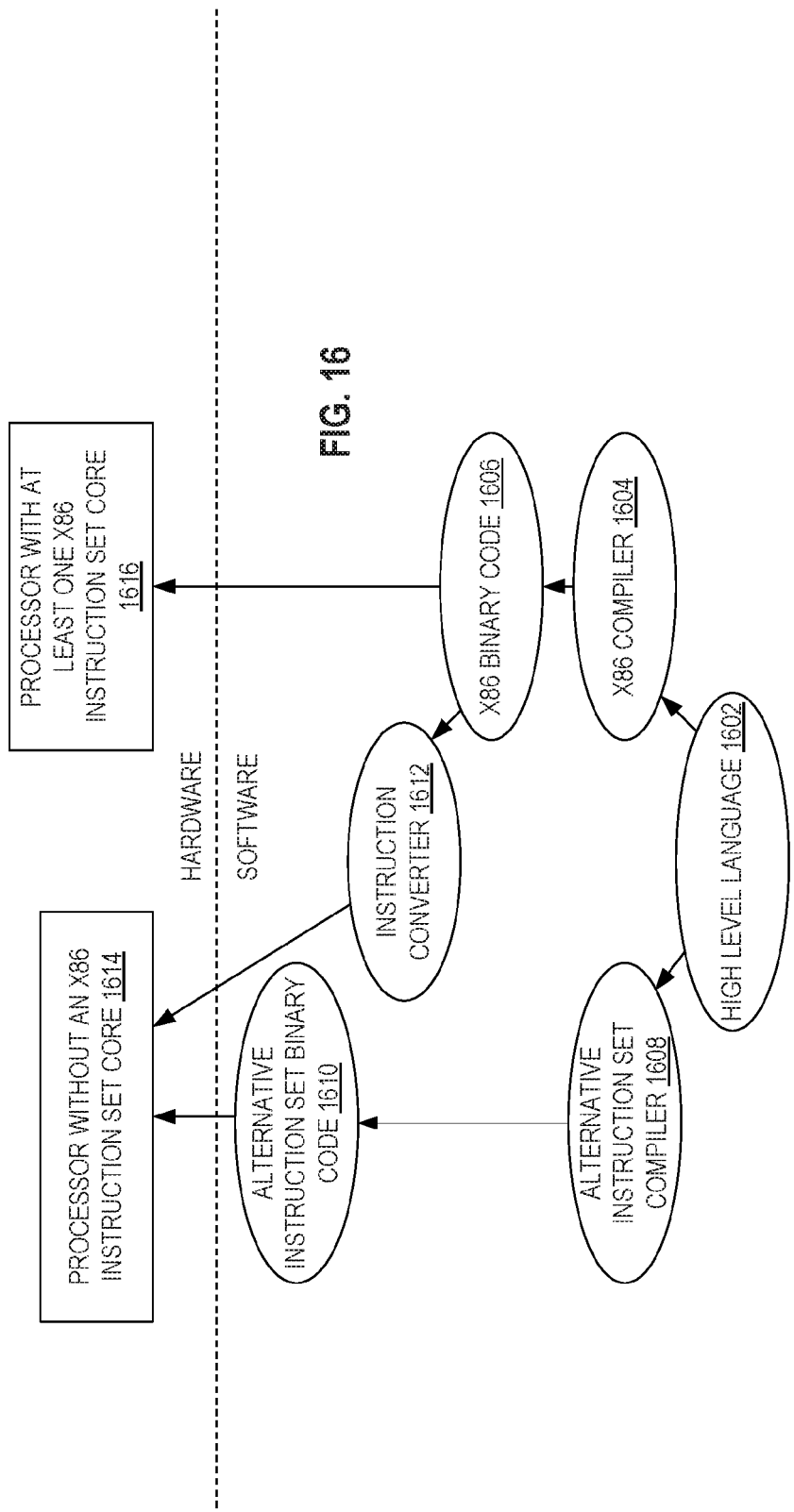
FIG. 16 is a block diagram contrasting the use of a software instruction converter to convert binary instructions in a source instruction set to binary instructions in a target instruction set according to embodiments of the invention.

FIG. 16 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 16 shows a program in a high level language 1602 may be compiled using an x86 compiler 1604 to generate x86 binary code 1606 that may be natively executed by a processor with at least one x86 instruction set core 1616. The processor with at least one x86 instruction set core 1616 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 16 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

What is claimed is:
1. An apparatus comprising:
a reliability assessment engine (RAE) stored in non-volatile memory; and
processing circuitry to execute the RAE to:
receive data of at least one physical condition from a plurality of intra-die variation monitoring circuits;
apply the received data to at least one reliability physics model, wherein the reliability physics model includes a time dependent dielectric breakdown model, a bias temperature stability model, an electromigration model, a negative/positive bias tem- perature model, an integrated reliability model, an edge damage monitor, a statistical model, and a fin-self-heat model;

calculate at least one of an estimated amount of lifetime consumed and an estimated amount of lifetime remaining based on the reliability physics model output; and adjust an operation parameter based at least in part on the calculated amount of lifetime remaining.

2. The apparatus of claim 1, wherein the statistical model comprises a Markov failure prediction model.

3. The apparatus of claim 1, wherein the data of at least one physical condition sensed during a period of operation includes one or more sensed voltages, average of the one or more sensed voltages, one or more sensed temperatures, average of the one or more sensed temperatures, one or more workload measures, or average of the one or more workload measures.

4. The apparatus of claim 1, wherein the RAE is part of power control circuitry.

5. The apparatus of claim 1, wherein the RAE is to receive an indication of a desired performance state and adjust an operation parameter of an integrated circuit based at least in part on the received indication such that at least one of an average voltage, average temperature, or average workload metric is within a desired range.

6. The apparatus of claim 1, further comprising:
a network interface communicatively coupled to the RAE to transmit and receive information to other RAEs.

7. The apparatus of claim 1, wherein the RAE is to select a reliability physics model from the plurality of reliability physics models.

8. A method comprising:
receiving data representing at least one physical condition of an integrated circuit;
calculating an estimated amount of lifetime remaining of the integrated circuit using at least one on-die reliability physics model, wherein the reliability physics model includes a time dependent dielectric breakdown model, a bias temperature stability model, an electromigration model, a negative/positive bias temperature model, an integrated reliability model, an edge damage monitor, a statistical model, and a fin-self-heat model; and
adjusting an operating parameter of the integrated circuit based on the calculated estimated amount of lifetime remaining of the integrated circuit.

9. The method of claim 8, wherein the statistical model comprises a Markov failure prediction model.

10. The method of claim 8, wherein the data representing at least one physical condition includes one or more sensed voltages, average of the one or more sensed voltages, one or more sensed temperatures, average of the one or more sense temperatures, one or more workload measures, or average of the one or more workload measures.

11. The method of claim 8, further comprising:
updating at least one of the on-die reliability physics models.

12. The method of claim 8, wherein the operating parameter is adjusted such that at least one of an average voltage, average temperature, or average workload metric is within a desired range.

13. The method of claim 8, further comprising:
calculating an estimated amount of lifetime consumed for the integrated circuit.

14. A method comprising:
receiving data representing at least one physical condition of an integrated circuit and a calculation related to a lifetime of the integrated circuit, wherein the calculation related to a lifetime of the integrated circuit is based on a reliability physics model and the reliability physics model is one or more of an edge damage monitor and a fin-self-heat model;
determining a desired performance state for the integrated circuit; and
transmitting information about the desired performance state to a die having the integrated circuit, whereby an operating parameter of the integrated circuit is adjusted to fit the desired performance state.

15. The method of claim 14, the reliability physics model is one or more of a time dependent dielectric breakdown model, a bias temperature stability model, an electromigration model, a negative/positive bias temperature model, an integrated reliability model, a statistical model.

16. The method of claim 14, wherein the data representing at least one physical condition includes one or more sensed voltages, average of the one or more sensed voltages, one or more sensed temperatures, average of the one or more sense temperatures, one or more workload measures, or average of the one or more workload measures.

* * * * *